United States Patent
Jarupoonphol et al.

(10) Patent No.: US 8,519,933 B2
(45) Date of Patent: Aug. 27, 2013

(54) SEMICONDUCTOR CIRCUIT, SHIFT REGISTER CIRCUIT, DISPLAY DEVICE, AND ELECTRONIC APPARATUS

(75) Inventors: Werapong Jarupoonphol, Kanagawa (JP); Yuko Yamauchi, Kanagawa (JP); Yoshiharu Nakajima, Kanagawa (JP)

(73) Assignee: Japan Display West Inc., Aichi-Ken (JP)

( * ) Notice: Subject to any disclaimer, the term of this patent is extended or adjusted under 35 U.S.C. 154(b) by 1421 days.

(21) Appl. No.: 11/902,837

(22) Filed: Sep. 26, 2007

(65) Prior Publication Data
US 2008/0130821 A1    Jun. 5, 2008

(30) Foreign Application Priority Data
Oct. 5, 2006 (JP) ................ P2006-273613

(51) Int. Cl.
G09G 3/36 (2006.01)
(52) U.S. Cl.
USPC ........................................... 345/100
(58) Field of Classification Search
USPC .............. 377/64; 327/365; 345/98–100
See application file for complete search history.

(56) References Cited

U.S. PATENT DOCUMENTS
2005/0184932 A1 * 8/2005 Ishikawa .............. 345/75.1

FOREIGN PATENT DOCUMENTS
| JP | 10-302494 | | 11/1998 |
| JP | 2002-041244 | | 2/2002 |
| JP | 2002175050 A | * | 6/2002 |
| JP | 2002-258819 A | | 9/2002 |
| JP | 2007-525982 A | | 9/2007 |
| WO | WO-2007/010835 A1 | | 1/2007 |

OTHER PUBLICATIONS

Japanese Office Action issued Mar. 13, 2012 for corresponding Japanese Application No. 2006-273613.
Office Action from Japan Patent Office for JP 2006-273613 dated Sep. 11, 2012.

* cited by examiner

*Primary Examiner* — Waseem Moorad
(74) *Attorney, Agent, or Firm* — Rader, Fishman & Grauer PLLC

(57) ABSTRACT

A semiconductor circuit which outputs an active potential in a first period and which holds an inactive potential in a second period which is longer than the first period and then outputs the inactive potential, the semiconductor circuit includes a switch element which is connected between a potential supply section which supplies the inactive potential and a circuit output terminal, and which is brought into a conduction state in the second period so as to output the inactive potential to the circuit output terminal.

17 Claims, 14 Drawing Sheets

INPUT/OUTPUT
POTENTIAL OF
LATCH CIRCUIT

SEMICONDUCTOR CIRCUIT, SHIFT REGISTER CIRCUIT, DISPLAY DEVICE, AND ELECTRONIC APPARATUS

CROSS REFERENCES TO RELATED APPLICATIONS

The present invention contains subject matter related to Japanese Patent Application JP 2006-273613 filed in the Japanese Patent Office on Oct. 5, 2006, the entire contents of which are incorporated-herein by reference.

BACKGROUND OF THE INVENTION

1. Field of the Invention

The present invention relates to semiconductor circuits, shift register circuits, and display devices, and particularly, relates to a semiconductor circuit, a shift register circuit, and a display device which are formed on an insulating substrate. The present invention also relates to an electronic apparatus in which such a display device is incorporated.

2. Description of the Related Art

In general, a known semiconductor circuit, for example, a shift register circuit uses a single phase clock as a reference clock for an operation in order to reduce power consumption, and uses a latch circuit in order to improve a potential holding characteristic and in order to operate even in a case where a device having a poor transistor characteristic such as a low-temperature polysilicon is employed (for example, refer to Japanese Unexamined Patent Application Publication Nos. 2002-175050 and 10-302494).

In not only a transistor using a low-temperature polysilicon but also a transistor using a silicon having a defect, a characteristic of the transistor statically or dynamically (transiently) changes (for example, refer to "Characterization of Switching Transient Behavior in Polycrystalline-Silicon Thin-Film Transistors," Hiroyuki Ikeda, Japanese Journal of Applied Physics Vol. 43, No. 2, 2004, pp. 477-484).

FIG. 10 shows a configuration of a shift register circuit according to Japanese Unexamined Patent Application Publication No. 2002-175050. In FIG. 10, although only an n-th transfer stage (unit circuit) 101n and an (n+1)th transfer stage 101n+1 are shown for simplicity, other transfer stages have the same configurations. Detailed description of the configurations will be made by taking the n-th transfer stage 101n as an example.

In FIG. 10, a switch 103 is connected between a clock line 102 and the n-th transfer stage 101n. The switch 103 is controlled to be turned on and off using a clock selection control circuit, which will be described later, so as to selectively supply a single-phase horizontal transfer clock HCK transmitted from the clock line 102 to the n-th transfer stage 101n.

The n-th transfer stage 101n includes a latch circuit 104 which latches the horizontal transfer clock HCK selectively supplied through the switch 103, a buffer circuit 105 which outputs a latch pulse supplied from the latch circuit 104, and a clock selection control circuit such as an OR circuit 106 which controls the switch 103 in accordance with a latch pulse Ain output from a (n−1)th transfer stage and a latch pulse Aout output from the n-th transfer stage 101n itself.

FIG. 11 shows a configuration of the latch circuit 104. As shown in FIG. 11, the latch circuit 104 includes a CMOS inverter 201 having a P-channel MOS transistor Qp201 and an N-channel MOS transistor Qn201, and a CMOS inverter 202 having a P-channel MOS transistor Qp202 and an N-channel MOS transistor Qn202. An input terminal (a common connection node of the gate of the transistor Qp201 and the gate of the transistor Qn201) of the CMOS inverter 201 is connected to an output terminal (a common connection node of the drain of the transistor Qp202 and the drain of the transistor Qn202) of the CMOS inverter 202. An input terminal (a common connection node of the gate of the transistor Qp202 and the gate of the transistor Qn202) of the CMOS inverter 202 is connected to an output terminal (a common connection node of the drain of the transistor Qp201 and the drain of the transistor Qn201) of the CMOS inverter 201.

Operation of the latch circuit 104 having the configuration described above will now be described with reference to FIG. 12 which shows a waveform timing chart illustrating a change of an input/output potential of the latch circuit 104. Note that a shift register circuit is a unique circuit characterized by outputting a signal which is in a low level state (hereinafter referred to as an "L-level" state) for a long period of time and which is in a high level state (hereinafter referred to as an "H-level" state) for a short period of time. The "L-level" and the "H-level" can be reversed in accordance with logic of the shift register circuit.

In a period A in which the switch 103 shown in FIG. 10 is in an off-state, since an input/output potential of the latch circuit 104, that is, a potential of the input terminal of the CMOS inverter 201 is in the L-level state (for example, a ground (GND) level) for a long period of time, the transistors Qp201 is brought into an enhancement state and the transistor Qn201 is brought into a depression state.

In this period A, since a potential of the input terminal of the CMOS inverter 202 (a potential of the output terminal CMOS inverter 201) is in the H-level state (for example, a power supply potential VDD) for a long period of time, the transistors Qp202 is brought into the depression state and the transistor Qn202 is brought into the enhancement state. In this case, when the switch 103 shown in FIG. 10 is turned on and the horizontal transfer clock HCK is supplied to the latch circuit 104, the potential of the input terminal of the CMOS inverter 201 steeply rises in a period B.

In a period C which is as short as a half cycle of the horizontal transfer clock HCK, the potential of the input terminal of the CMOS inverter 201 is brought into the H-level state and the potential of the input terminal of the CMOS inverter 202 is brought into the L-level state. Since time required for changing from an enhancement state to a depression state is longer than time required for changing from the depression state to the enhancement state, all the transistors Qp201, Qn201, Qp202, and Qn202 included in the latch circuit 104 are brought into the enhancement state.

Then, when the horizontal transfer clock HCK falls, since all the transistors Qp201, Qn201, Qp202, and Qn202 are in the enhancement state, the potential of the input terminal of the CMOS inverter 201 (the potential of the output terminal of the CMOS inverter 202) gradually (gently) falls in a period D.

SUMMARY OF THE INVENTION

As described above, if a transistor characteristic dynamically (transiently) changes, since the potential of the input terminal of the CMOS inverter 201 gradually falls when the horizontal transfer clock HCK falls, widths of waveforms output from the shift register circuit vary. This variation leads to insufficient margins for a change of the transistor characteristic and for a change of an operating frequency, reliability degradation, and difficulty of high-speed drive.

Note that a shift register circuit is taken as an example of a semiconductor circuit and problems thereof are described above. However, these problems arise in not only a shift register circuit but also any other semiconductor circuit including a circuit element which is used to hold a potential in operation and whose characteristic dynamically changes.

It is desirable to provide a semiconductor circuit, a shift register circuit, and a display device which realize an output waveform having a constant width, sufficient margins for a change of a transistor characteristic and for a change of an operating frequency, high reliability, and high-speed drive.

According to an embodiment of the present invention, there is provided a semiconductor circuit which outputs an active potential in a first period and which holds an inactive potential in a second period which is longer than the first period and then outputs the inactive potential, the semiconductor circuit including a switch element which is connected between a potential supply section which supplies the inactive potential and a circuit output terminal, and which is brought into a conduction state in the second period so as to output the inactive potential to the circuit output terminal. The semiconductor circuit is used as a unit circuit (a cell/a transfer stage) of a shift register circuit. In addition, a shift register circuit using the semiconductor circuit as a unit circuit is used in a display device, which includes a pixel array portion having pixels constituted by electro-optical elements arranged in a matrix, as a shift register circuit constituting a driving circuit which drives the pixels in the pixel array portion.

In the semiconductor circuit, the shift register circuit, and the display device configured as above, since the switch element connected between the potential supply section which supplies the inactive potential and the circuit output terminal is used instead of a latch circuit in order to hold the inactive potential in the second period and then output the inactive potential, an adverse effect of a transitional change of a transistor characteristic of the latch circuit may be avoided.

Accordingly, since an adverse effect of a transitional change of a transistor characteristic of the latch circuit is avoided, an output waveform having a constant width is attained, and accordingly, sufficient margins for a change of a transistor characteristic and for a change of an operating frequency, high reliability, and high-speed drive are also attained.

DESCRIPTION OF THE PREFERRED EMBODIMENTS

Embodiments of the present invention will be described in detail hereinafter with reference to the accompanying drawings.

First Embodiment

Figure 1:
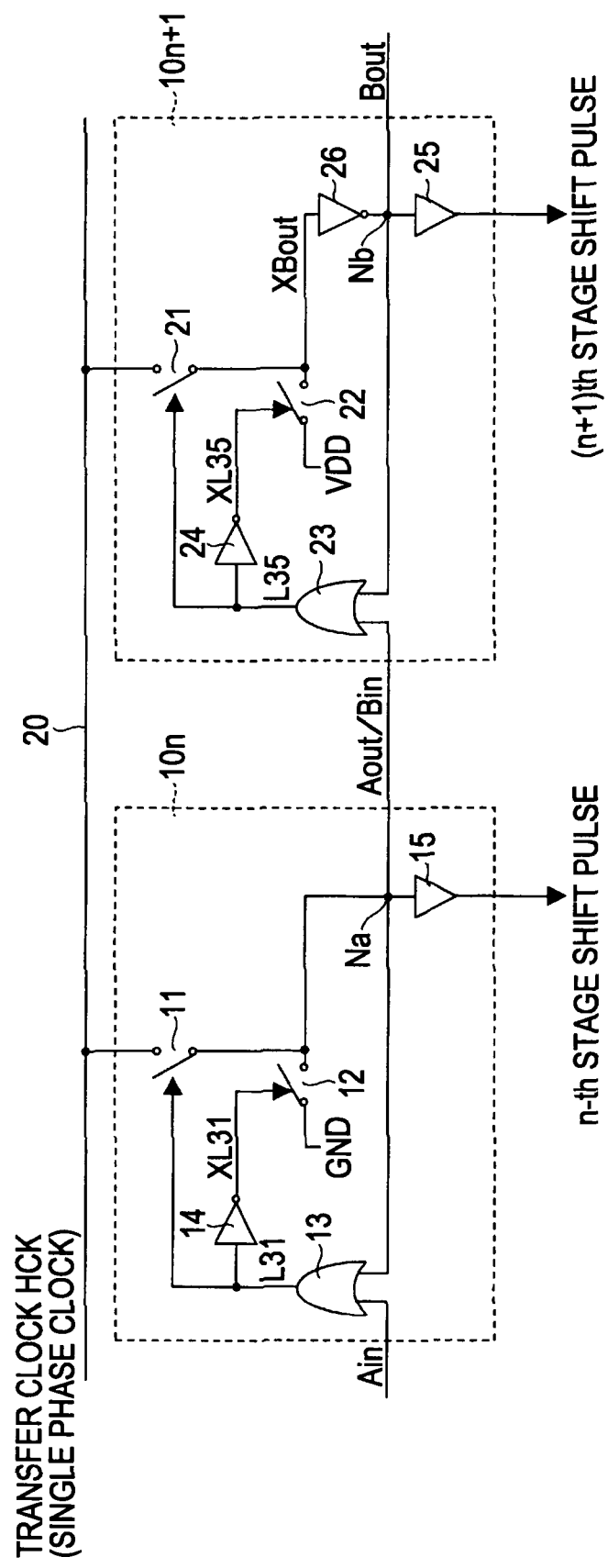
FIG. 1 is a block diagram illustrating a configuration example of a shift register circuit according to a first embodiment of the present invention.

FIG. 1 is a block diagram illustrating a configuration of a semiconductor circuit, such as a shift register circuit, according to a first embodiment of the present invention. The shift register circuit of this embodiment includes an insulating substrate and is formed of a polysilicon, for example.

Although the shift register circuit includes a plurality of unit circuits (cells: hereinafter referred to as "transfer stages") connected to each other in series, only an n-th transfer stage $10n$ and an (n+1)th transfer stage $10n+1$ are representatively shown for simplicity.

n-th Transfer Stage

The n-th transfer stage $10n$ includes a first switch element 11, a second switch element 12, an OR circuit 13, an inverter 14, and a buffer circuit 15.

The first switch element 11 has a first terminal connected to a clock supply line 20 which supplies a single-phase horizontal transfer clock HCK. The second switch element 12 has a first terminal connected to a potential supply section which supplies a ground potential GND and a second terminal connected to a second terminal of the first switch element 11 and connected to an output node Na which is a circuit output terminal of the n-th transfer stage $10n$. Each of the first switch element 11 and the second switch element 12 is constituted by a transistor, for example.

The OR circuit (control circuit) 13 receives a pulse Ain input to the n-th transfer stage $10n$ (that is, a pulse output from the (n−1)th transfer stage $10n-1$) and a pulse Aout output from the n-th transfer stage $10n$ itself to the output node Na as two inputs. An output pulse of the OR circuit 13 is supplied to the first switch element 11 as a control pulse which controls the first switch element 11 to be turned on (a conduction state) or off (a non-conduction state). In addition, the output pulse of the OR circuit 13 is supplied through the inverter 14 to the second switch element 12 as a control pulse which controls the second switch element 12 to be turned on or off.

The first switch element 11 and the second switch element 12 perform operations complementarily with each other. That is, when the first switch element 11 is in an on-state, the second switch element 12 is in an off-state, whereas when the first switch element 11 is in an off-state, the second switch element 12 is in an on-state.

The output pulse Aout obtained in the output node Na is supplied to the (n+1)th transfer stage 10n+1 as an input pulse Bin and is output through the buffer circuit 15 as a shift pulse of the n-th transfer stage 10n.

(n+1)th Transfer Stage

The (n+1)th transfer stage 10n+1 includes a first switch element 21, a second switch element 22, an OR circuit 23, an inverter 24, a buffer circuit 25, and an inverter 26.

The first switch element 21 is a first terminal connected to the clock supply line 20. The second switch element 22 has a first terminal connected to the potential supply section which supplies a power source potential VDD and a second terminal connected to a second terminal of the first switch element 21 and connected to an output node Nb which is a circuit output terminal of the (n+1)th transfer stage 10n+1 through the inverter 26. Each of the first switch element 21 and the second switch element 22 is constituted by a transistor, for example.

The OR circuit (control circuit) 23 receives a pulse Bin input to the (n+1)th transfer stage 10n+1 (that is, the pulse Aout output from the n-th transfer stage 10n) and a pulse Bout output from the (n+1)th transfer stage 10n+1 to the output node Nb as two inputs. An output pulse of the OR circuit 23 is supplied to the first switch element 21 as a control pulse which controls the first switch element 21 to be turned on (a conduction state) or off (a non-conduction state). In addition, the output pulse of the OR circuit 23 is supplied through the inverter 24 to the second switch element 22 as a control pulse which controls the second switch element 22 to be turned on or off.

As with the relationship between the first switch element 11 and the second switch element 12, the first switch element 21 and the second switch element 22 perform operations complementarily with each other. Each of the outputs from the first switch element 21 and the second switch element 22 is subjected to polarity reversal processing using the inverter 26, is supplied to the output node Nb as an output pulse Bout of the (n+1)th transfer stage 10n+1, and is then supplied to a next stage, that is, an (n+2)th transfer stage 10n+2 as an input pulse. In addition, each of the outputs from the first switch element 21 and the second switch element 22 is output as a shift pulse of the (n+1)th transfer stage 10n+1 through the buffer circuit 25.

Figure 2:
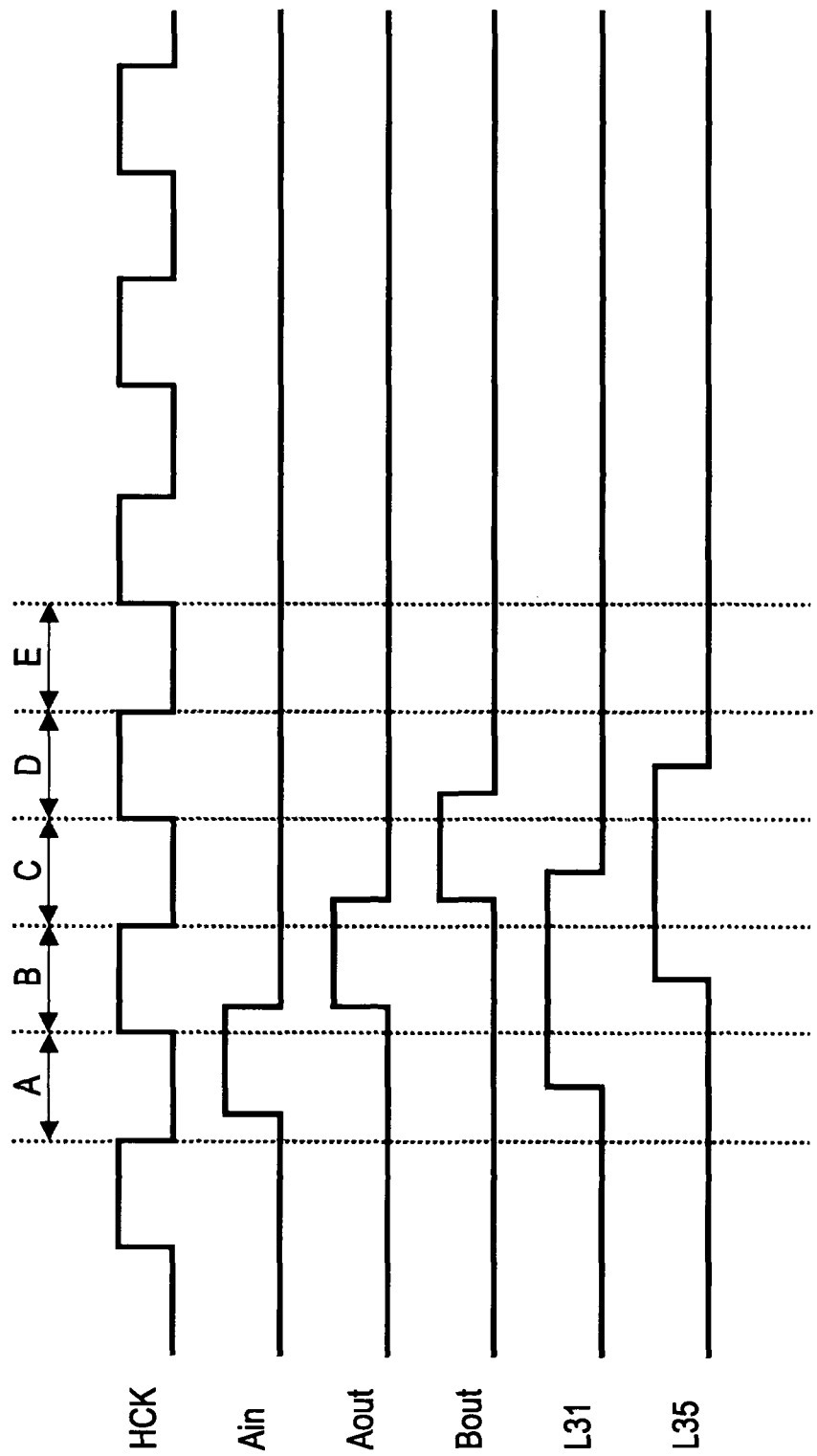
FIG. 2 is a waveform timing chart illustrating an operation of the shift register circuit according to the first embodiment.

FIG. 2 is a waveform timing chart illustrating an operation of the shift register circuit having the configuration described above according to the first embodiment. Note that, as shown in the waveform timing chart of FIG. 2, the output pulse Aout and the output pulse Bout slightly delay relative to the horizontal transfer clock HCK since the output pulse Aout and the output pulse Bout pass through the first switch elements 11 and 21, respectively.

In a period A in which the horizontal transfer clock HCK is in the L-level state, when an input pulse Ain in the H-level state is supplied from the (n−1)th transfer stage 10n-1 to the n-th transfer stage 10n, an output L31 of the OR circuit 13 is brought into the H-level state. Accordingly, the first switch element 11 is turned on, and the second switch element 12 is turned off in accordance with an inverted output XL31 of the inverter 14. Consequently, the output node Na is only influenced by the horizontal transfer clock HCK.

Next, in a period B in which the horizontal transfer clock HCK is in the H-level state, since the output node Na is only influenced by the horizontal transfer clock HCK, the output pulse Aout of the n-th transfer stage 10n is brought into the H-level state. Furthermore, in a period C in which the horizontal transfer clock HCK is in the L-level state, the output pulse Aout is also brought into the L-level state.

At this time, since the input pulse Ain of the n-th transfer stage 10n is in the L-level state and the output pulse Aout of the n-th transfer stage 10n is also in the L-level state, the first switch element 11 is turned off and the second switch element 12 is turned on. Since the second switch element 12 is turned on, the ground potential GND is supplied to the output node Na. Consequently, a potential of the output node Na is kept in the L-level state.

Specifically, the output pulse Aout has an active potential, that is, an H-level potential, in a first period. Then, the output pulse Aout keeps an inactive potential that is, an L-level potential in a second period which is a long period and which lasts until the next input pulse Ain is supplied.

Similarly, in the period B, when the input pulse Bin (the output pulse Aout of the n-th transfer stage 10n) in the H-level state is supplied to the (n+1)th transfer stage 10n+1, an output pulse L35 of the OR circuit 23 is brought into the H-level state. Accordingly, the first switch element 21 is turned on, and the second switch element 22 is turned off in accordance with an inverted output XL35 output from the inverter 24. Consequently, the output node Nb is only influenced by the horizontal transfer clock HCK obtained through the polarity reversal processing in the inverter 26.

Then, in a period C in which the horizontal transfer clock HCK is in the L-level state, since the output node Nb is only influenced by the horizontal transfer clock HCK obtained through the polarity reversal processing in the inverter 26, the output pulse Bout of the (n+1)th transfer stage 10n+1 is brought into the H-level state. Subsequently, in a period D in which the horizontal transfer clock HCK is in the H-level state, the output pulse Bout is brought into the L-level state.

At this time, since the input pulse Bin of the (n+1)th transfer stage 10n+1 (the output pulse Aout of the n-th transfer stage 10n) is in the L-level state and the output pulse Bout of the (n+1)th transfer stage 10n+1 is also in the L-level state, the first switch element 21 is turned off and the second switch element 22 is turned on. Since the second switch element 22 is turned on, the power source potential VDD is subjected to the polarity reversal processing using the inverter 26 and supplied to the output node Nb. Consequently, a potential of the output node Nb is kept in the L-level state.

Specifically, the output pulse Bout keeps the L-level state for a long period of time until the next input pulse Bin is supplied. However, since the output pulse Bout is obtained through the polarity reversal processing using the inverter 26, as with the case of n-th transfer stage 10n, an output pulse (a pulse input to the inverter 26) XBout of the (n+1)th transfer stage 10n+1 which has yet to be subjected to the polarity reversal processing has an active potential, that is, an L-level potential in a first period. Then, the output pulse XBout keeps an inactive potential, that is, an H-level potential in a second period which is a long period and which lasts until the next input pulse Bin is supplied.

As described above, the shift register circuit is configured such that each of the transfer stages including n-th transfer stage 10n and (n+1)th transfer stage 10n+1 outputs an active potential (the power supply potential VDD in the n-th transfer stage 10n and the ground potential GND in the (n+1)th transfer stage 10n+1) in a first period. In addition, the shift register circuit has a potential maintaining function (a latch function) of maintaining an inactive potential (the ground potential GND in the n-th transfer stage 10n and the power supply potential VDD in the (n+1)th transfer stage 10n+1) in a second period which is longer than the first period and then outputting the inactive potential. In this shift register circuit, since the inactive potential (the ground potential GND/power supply potential VDD) which is a fixed potential is maintained during the entire second period using the functions of the second switch elements 12 and 22 instead of latch functions of latch circuits, the shift register circuit is not influenced by a transitional change of a transistor characteristic of latch circuits.

Figure 11:
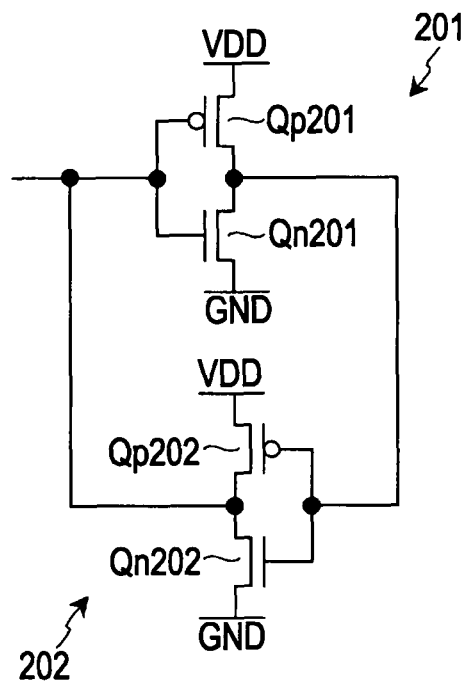
FIG. 11 is a circuit diagram illustrating a configuration example of a latch circuit.
Figure 12:
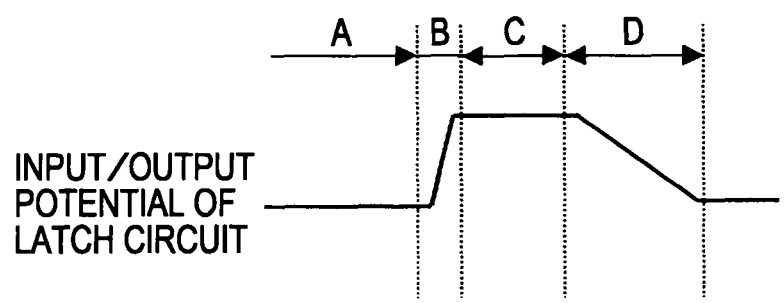
FIG. 12 is a waveform timing chart used to explain disadvantages of the related art.

Accordingly, since a waveform output from the shift register circuit has a constant width, sufficient margins for a change of a transistor characteristic and for a change of an operating frequency, high reliability, and high-speed drive can be attained. Furthermore, since the latch circuits may be removed, four transistors (refer to FIG. 11) per transfer stage may be eliminated, that is, the number of transistors may be eliminated by four times the number of stages of the shift register circuit (the number of cells), the size of the shift register circuit may be considerably reduced.

Modification

Figure 3:
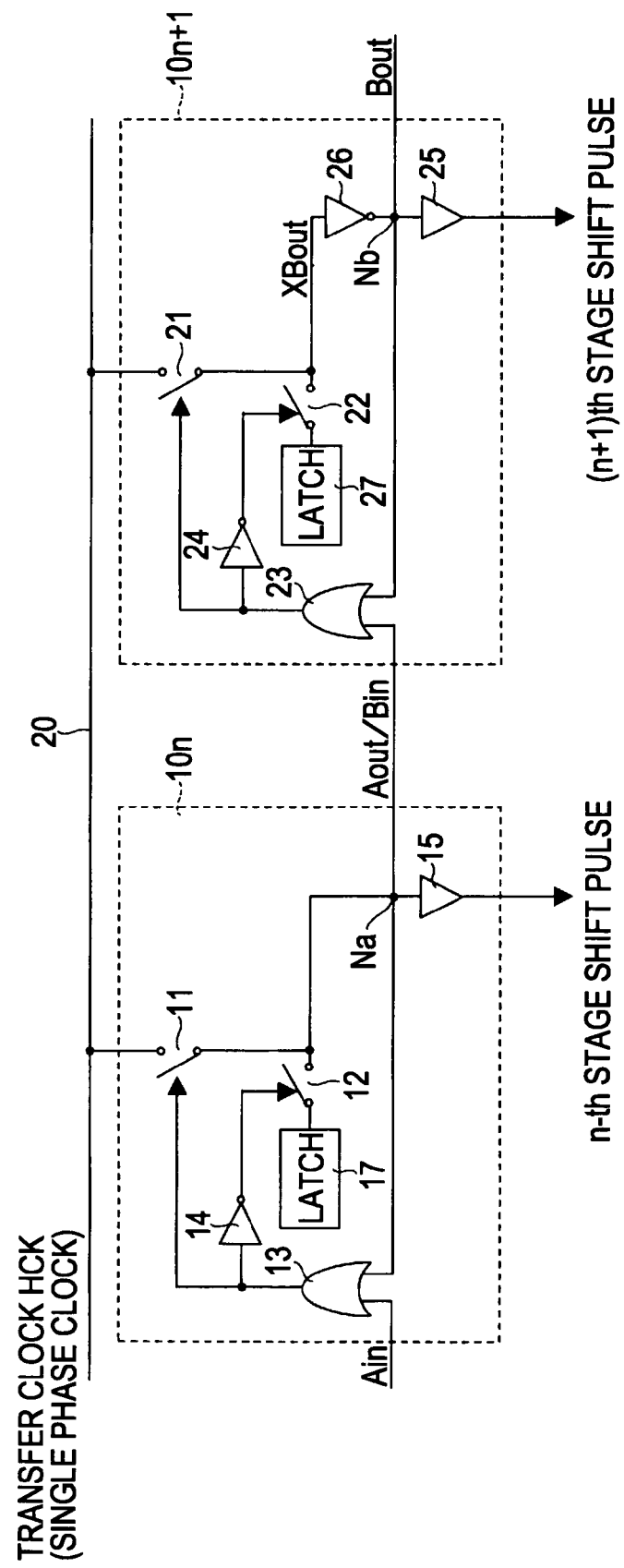
FIG. 3 is a block diagram illustrating a configuration example of a shift register circuit according to a modification of the first embodiment.

FIG. 3 is a block diagram illustrating a configuration example of a shift register circuit according to a modification of the first embodiment. Reference numerals the same as those used in FIG. 1 are used in FIG. 3 to denote similar components.

As shown in FIG. 3, the shift register circuit according to this modification is different from the shift register circuit of the first embodiment shown in FIG. 1 in that latch circuits 17 and 27 are used instead of the potential supply section (power supply section) which supplies the ground potential GND (in the n-th transfer stage 10n) and the power supply potential VDD (in the (n+1)th transfer stage 10n+1) as inactive potentials. Specifically, each of the second switch elements 12 and 22 has a first terminal connected to an input/output terminal of a corresponding one of the latch circuits 17 and 27.

Other portions of the configuration of the shift register circuit according to the modification are basically the same as those of the shift register circuit according to the first embodiment. That is, the control pulse of the second switch element 12 has an inverse theory relative to the control pulse of the first switch element 11. Accordingly, when the first switch element 11 is turned on, the second switch element 12 is turned off, whereas when the first switch element 11 is turned off, the second switch element 12 is turned on.

Similarly, the control pulse of the second switch element 22 has an inverse theory relative to the control pulse of the first switch element 21. Accordingly, when the first switch element 21 is turned on, the second switch element 22 is turned off, whereas when the first switch element 21 is turned off, the second switch element 22 is turned on.

An operation of the shift register circuit according to the modification of the first embodiment configured as above will now be described with reference to the waveform timing chart shown in FIG. 2.

In a period A, when a horizontal transfer clock HCK is brought into the L-level state and an H-level input pulse Ain is supplied from the (n−1)th transfer stage 10n−1 to the n-th transfer stage 10n, an output pulse of the OR circuit 13 is brought into the H-level state. Accordingly, the first switch element 11 is turned on and the second switch element 12 is turned off. Consequently, the output node Na is only influenced by the horizontal transfer clock HCK.

In a period B, when the horizontal transfer clock HCK is brought into the H-level state, since the output node Na is only influenced by the horizontal transfer clock HCK, an output pulse Aout of the n-th transfer stage 10n is brought into the H-level state. Subsequently, in a period C, when the horizontal transfer clock HCK is brought into the L-level state, the output pulse Aout is also brought into the L-level state.

Here, since an on/off state of the second switch element 12 is opposite to an on/off state of the first switch element 11, the second switch element 12 is in the off-state during a period in which the output pulse Aout of the n-th transfer stage 10n is in the H-level state. Accordingly, the output pulse Aout is not influenced by a dynamic change of a characteristic of the latch circuit 17. When the output pulse Aout changes from the H-level state to the L-level state, the second switch element 12 is turned on after a delay generated by the OR circuit 13 and the inverter 14.

When the second switch element 12 is turned on, the input/output terminal of the latch circuit 17 is connected to the second terminal (the output node Na) of the first switch element 11. Then, the L-level potential of the second terminal of the first switch element 11 is latched in the latch circuit 17, and a potential of the output node Na is kept in the L-level state.

Specifically, the output pulse Aout has an active potential, that is, an H-level potential in a first period, and keeps an inactive potential, that is, an L-level potential in a second period which is a long period and which lasts until the next input pulse Ain is supplied.

Similarly, in the period B, when the input pulse Bin (the output pulse Aout of the n-th transfer stage 10n) in the H-level state is supplied to the (n+1)th transfer stage 10n+1, an output pulse of the OR circuit 23 is brought into the H-level state. Accordingly, the first switch element 21 is turned on, and the second switch element 22 is turned off. Consequently, the output node Nb is only influenced by the horizontal transfer clock HCK obtained through the polarity reversal processing in the inverter 26.

Then, in a period C in which the horizontal transfer clock HCK is in the L-level state, since the output node Nb is only influenced by the horizontal transfer clock HCK obtained through the polarity reversal processing in the inverter 26, the output pulse Bout of the (n+1)th transfer stage 10n+1 is brought into the H-level state. Subsequently, in a period D in which the horizontal transfer clock HCK is in the H-level state, the output pulse Bout is brought into the L-level state.

Here, since an on/off state of the second switch element 22 is opposite to an on/off state of the first switch element 21, the second switch element 22 is in the off-state during a period in which the output pulse Bout of the (n+1)th transfer stage 10n+1 is in the H-level state. Accordingly, the output pulse Bout is not influenced by a dynamic change of a characteristic of the latch circuit 27. When the output pulse Bout changes from the H-level state to the L-level state, the second switch element 22 is turned on after a delay generated by the OR circuit 23 and the inverter 24.

When the second switch element 22 is turned on, the input/output terminal of the latch circuit 27 is connected to the second terminal of the first switch element 21. Then, the H-level potential of the second terminal of the first switch element 21 is latched in the latch circuit 27, and a potential of the output node Na is kept in the L-level state.

Specifically, the output pulse Bout is kept in the L-level state for a long period of time until the next input pulse Bin is supplied. An output pulse XBout of the (n+1)th transfer stage 10n+1 which has yet to be subjected to the polarity reversal processing has an active potential, that is, an L-level potential in a first period. The output pulse XBout keeps an inactive potential, that is, an H-level potential in a second period which is a long period and which lasts until the next input pulse Bin is supplied.

As described above, even when the latch circuits 17 and 27 are employed instead of the potential supply portion which supplies the power supply potential VDD and the ground potential GND which are inactive potentials, the latch circuits 17 and 27 operate during a period in which the ground potential GND and the power supply potential VDD are latched by utilizing the second switch elements 12 and 22. Accordingly, unlike the related art, all transistors included in the latch circuits 17 and 27 are not brought into an enhancement state, and therefore, are not influenced by transitional changes of transistor characteristics of the latch circuits 17 and 27. Accordingly, unlike the first embodiment, the number of transistors is not reduced, but an output waveform having a constant width of the shift register circuit is realized. Consequently, sufficient margins for a change of a transistor characteristic and for a change of an operating frequency, high reliability, and high-speed drive are also attained.

Second Embodiment

Figure 4:
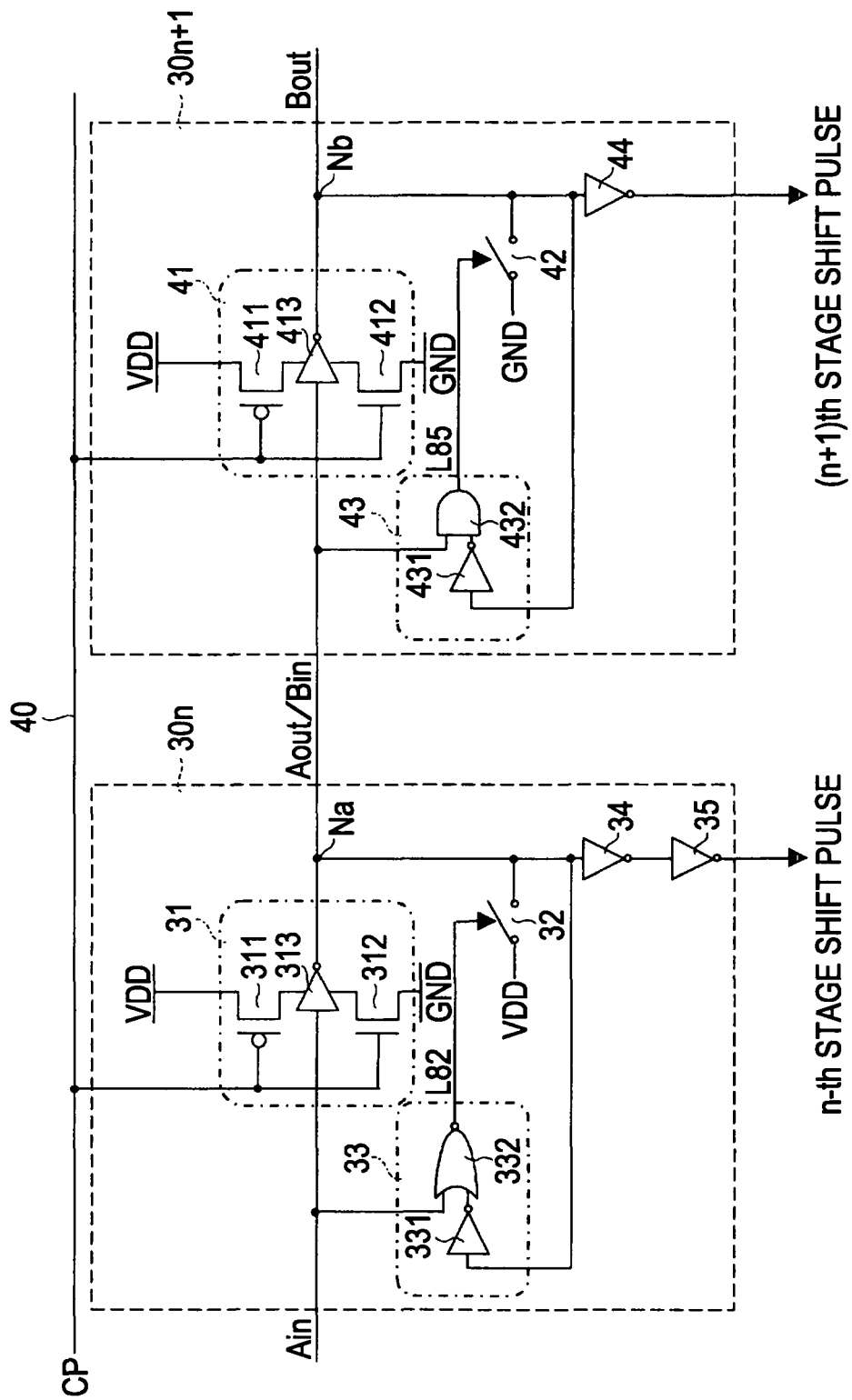
FIG. 4 is a block diagram illustrating a configuration example of a shift register circuit according to a second embodiment of the present invention.

FIG. 4 is a block diagram illustrating a configuration example of a shift register circuit employing a semiconductor circuit, such as a Tri-State Converter™, according to a second embodiment of the present invention. The shift register circuit of this embodiment also includes an insulating substrate and is formed of a polysilicon, for example.

Although the shift register circuit includes a plurality of transfer stages (unit circuits/cells) connected to each other in series, only an n-th transfer stage 30n and an (n+1)th transfer stage 30n+1 are representatively shown for simplicity.

n-th Transfer Stage

The n-th transfer stage 30n includes a tri-state inverter 31, a switch element 32, a control-pulse generation circuit 33, and inverters 34 and 35.

The tri-state inverter 31 includes a P-channel transistor 311, an N-channel transistor 312, and an inverter 313, and operates in synchronization with a single-phase shift clock CP supplied from a clock supply line 40. The tri-state inverter 31 performs polarity reversal processing on an input pulse Ain of the n-th transfer stage 30n (an output pulse of an (n−1)th transfer stage 30n−1), and the processed pulse Ain is output from the n-th transfer stage 30n as an output pulse Aout. The output pulse Aout is supplied to the (n+1)th transfer stage 30n+1 as an input pulse Bin, and meanwhile the output pulse Aout is supplied through the inverters 34 and 35 as a shift pulse of the n-th transfer stage 30n.

The switch element 32 has a first terminal connected to a potential supply section which supplies a power supply potential VDD and a second terminal connected to an output node Na which is a circuit output terminal of the n-th transfer stage 30n. The switch element 32 is constituted by a transistor, for example. The control-pulse generation circuit (a control circuit) 33 includes an inverter 331 which performs polarity reversal processing on the output pulse Aout of the n-th transfer stage 30n, and an NOR circuit 332 which receives a pulse output from the inverter 331 and the input pulse Ain of the n-th transfer stage 30n. The control-pulse generation circuit 33 generates a control pulse and the generated control pulse is supplied to the switch element 32 to be turned on or off.

(n+1)th Transfer Stage

The (n+1)th transfer stage 30n+1 includes a tri-state inverter 41, a switch element 42, a control pulse generation circuit 43, and an inverter 44.

The tri-state inverter 41 includes a P-channel transistor 411, an N-channel transistor 412, and an inverter 413, and operates in synchronization with the single-phase shift clock CP supplied from the clock supply line 40. The tri-state inverter 31 performs polarity reversal processing on an input pulse Bin of the n-th transfer stage 30n (an output pulse Aout of an n-th transfer stage 30n), and the processed pulse Bin is output from the (n+1)th transfer stage 30n+1 as an output pulse Bout. The output pulse Bout is supplied to the (n+2)th transfer stage 30n+2 as an input pulse of the (n+2)th transfer stage 30n+2, and meanwhile the output pulse Bout is output through the inverter 44 as a shift pulse of the (n+1)th transfer stage 30n+1.

The switch element 42 has a first terminal connected to the potential supply section which supplies the ground potential GND and a second terminal connected to an output node Nb which is a circuit output terminal of the (n+1)th transfer stage 30n+1. The switch element 42 is constituted by a transistor, for example. The control-pulse generation circuit (a control circuit) 43 includes an inverter 431 which performs polarity reversal processing on the output pulse Bout of (n+1)th transfer stage 30n+1, and an AND circuit 432 which receives a pulse output from the inverter 431 and the input pulse Bin of the (n+1)th transfer stage 30n+1 as two inputs. The control-pulse generation circuit 43 generates a control pulse and the generated control pulse is supplied to the switch element 42 to be turned on or off.

Figure 5:
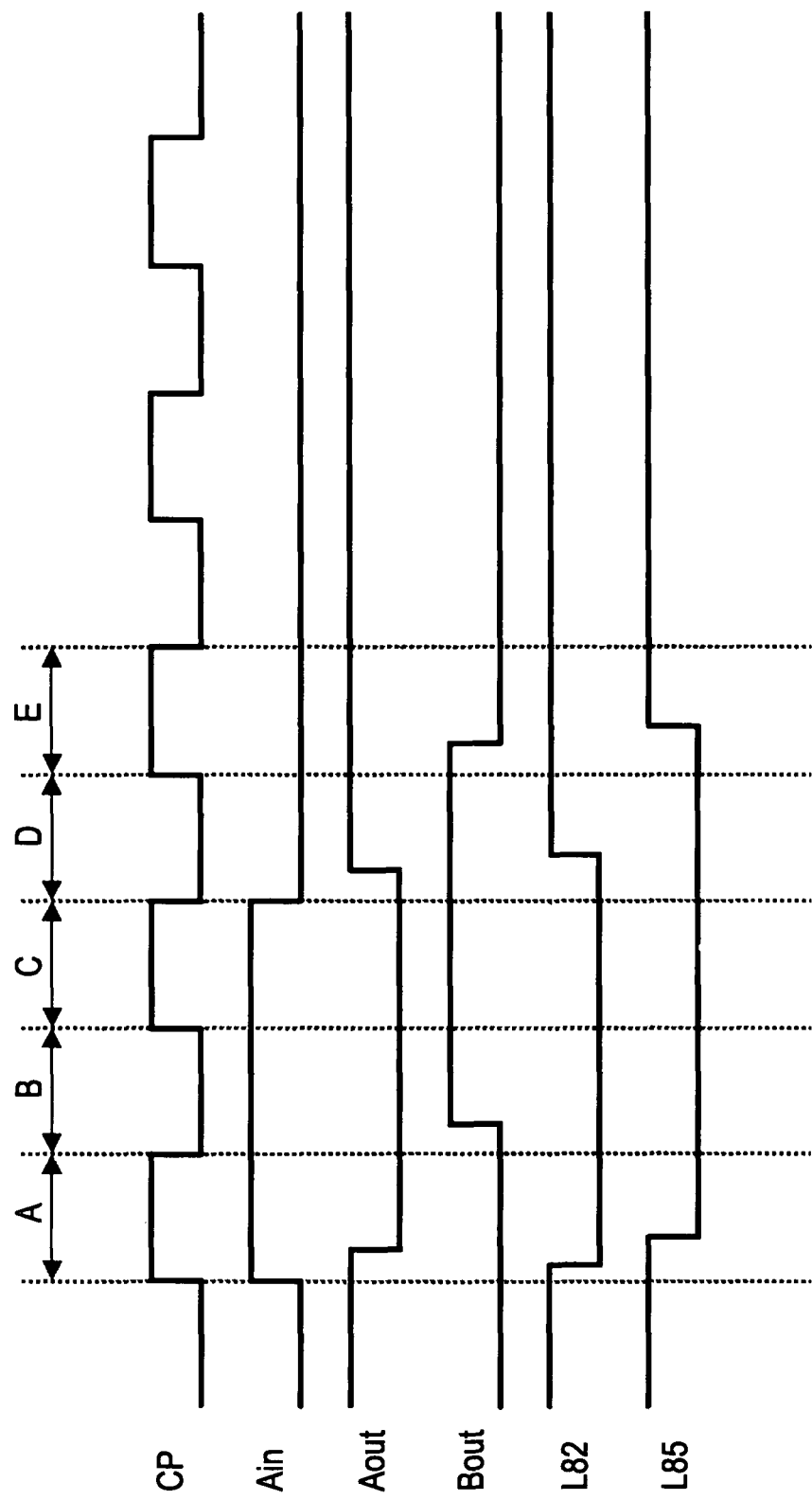
FIG. 5 is a waveform timing chart illustrating an operation of the shift register circuit according to the second embodiment.

An operation of the shift register circuit according to the second embodiment configured as above will now be described with reference to the waveform timing chart shown in FIG. 5. Note that, as shown in the waveform timing chart of FIG. 5, the output pulse Aout and the output pulse Bout slightly delay relative to the shift clock CP since the output pulse Aout and the output pulse Bout pass through the tri-state inverters 31 and 41, respectively.

In a period A, the input pulse Ain of the tri-state inverter 31 is brought into the H-level state and the shift clock CP is also brought into the H-level state, the N-channel transistor 312 of the tri-state inverter 31 is turned on. Accordingly, the output pulse Aout of the tri-state inverter 31 is brought into the L-level state. Since the input pulse Ain is in the H-level state, an output pulse L82 of the control-pulse generation circuit 33 is brought into the L-level state. Consequently, the switch element 32 is turned off and the output node Na and the power supply potential VDD are disconnected from each other.

In a period B, when the shift clock CP is brought into the L-level state, the output node Na of the n-th transfer stage 30n is brought into a floating state. Then, a potential of the output pulse Aout is kept in the L-level state using an output capacitor of the tri-state inverter 31 included in the n-th transfer stage 30n and an input capacitor of the tri-state inverter 41 included in the (n+1)th transfer stage 30n+1, for example.

In a period C, when the shift clock CP is brought into the H-level state, the N-channel transistor 312 of the tri-state inverter 31 is turned on. Consequently, the output pulse Aout of the tri-state inverter 31 keeps the L-level potential.

In a period D, when the input pulse Ain of the tri-state inverter 31 is brought into the L-level state and the shift clock CP is also brought into the L-level state, the P-channel transistor 311 of the tri-state inverter 31 is turned on. Consequently, the output pulse Aout of the tri-state inverter 31 is brought into the H-level state. Furthermore, since the switch element 32 is turned on and the output node Na is connected to the power supply potential VDD, the output pulse Aout is kept in the H-level state.

Specifically, the output pulse Aout has an active potential, that is, an L-level potential in the first period, and then, keeps an inactive potential, that is, an H-level potential in a second period which is a long period and which lasts until the next input pulse Ain is supplied.

A similar operation is performed in the (n+1)th transfer stage 30n+1. In a period B, the input pulse Bin (the output pulse Aout of the n-th transfer stage 30n) of the tri-state inverter 41 is brought into the L-level state and the shift clock CP is also brought into the L-level state, the P-channel transistor 411 of the tri-state inverter 41 is turned on. Accordingly, the output pulse Bout of the tri-state inverter 41 is brought into the H-level state. Since the input pulse Bin is in the L-level state, an output pulse L85 of the control-pulse generation circuit 43 is brought into the L-level state. Consequently, the switch element 42 is turned off and the output node Na and the ground potential GND are disconnected from each other.

In a period C, when the shift clock CP is brought into the H-level state, the output node Nb of the (n+1)th transfer stage 30n+1 is brought into a floating state. Then, a potential of the output pulse Bout is kept in the H-level state using an output capacitor of the tri-state inverter 41 included in the (n+1)th transfer stage 30n+1 and an input capacitor of the tri-state inverter included in the (n+2)th transfer stage 30n+2.

In a period D, when the shift clock CP is brought into the L-level state, the P-channel transistor 411 of the tri-state inverter 41 is turned on. Consequently, the output pulse Bout of the tri-state inverter 41 keeps the H-level potential.

In a period E, when the input pulse Bin of the tri-state inverter 41 is brought into the H-level state and the shift clock CP is also brought into the H-level state, the N-channel transistor 412 of the tri-state inverter 41 is turned on. Consequently, the output pulse Bout of the tri-state inverter 41 is brought into the L-level state. Furthermore, since the switch element 42 is turned on and the output node Nb is connected to the ground potential GND, the output pulse Bout is kept in the L-level state.

Specifically, the output pulse Bout has an active potential, that is, an H-level potential in the first period, and then, keeps an inactive potential, that is, an L-level potential in a second period which is a long period and which lasts until the next input pulse Bin is supplied.

As described above, in this shift register circuit employing the tri-state inverters 31 and 41, the potential supply section which supplies the power supply potential VDD and the ground potential GND and the switch elements 32 and 42 are employed instead of the latch circuits in order to realize the potential maintaining function of maintaining an inactive potential (the L-level potential in the n-th transfer stage 30n and the H-level potential in the (n+1)th transfer stage 30n+1) in a long period of time until the next input pulse Ain/Bin is supplied. Accordingly, since the shift register circuit is not influenced by a transitional change of a transistor characteristic of latch circuits, a constant width of a waveform output from the shift register circuit is realized. Consequently, sufficient margins for a change of a transistor characteristic and for a change of an operating frequency, high reliability, and high-speed drive can be attained.

Modification

Figure 6:
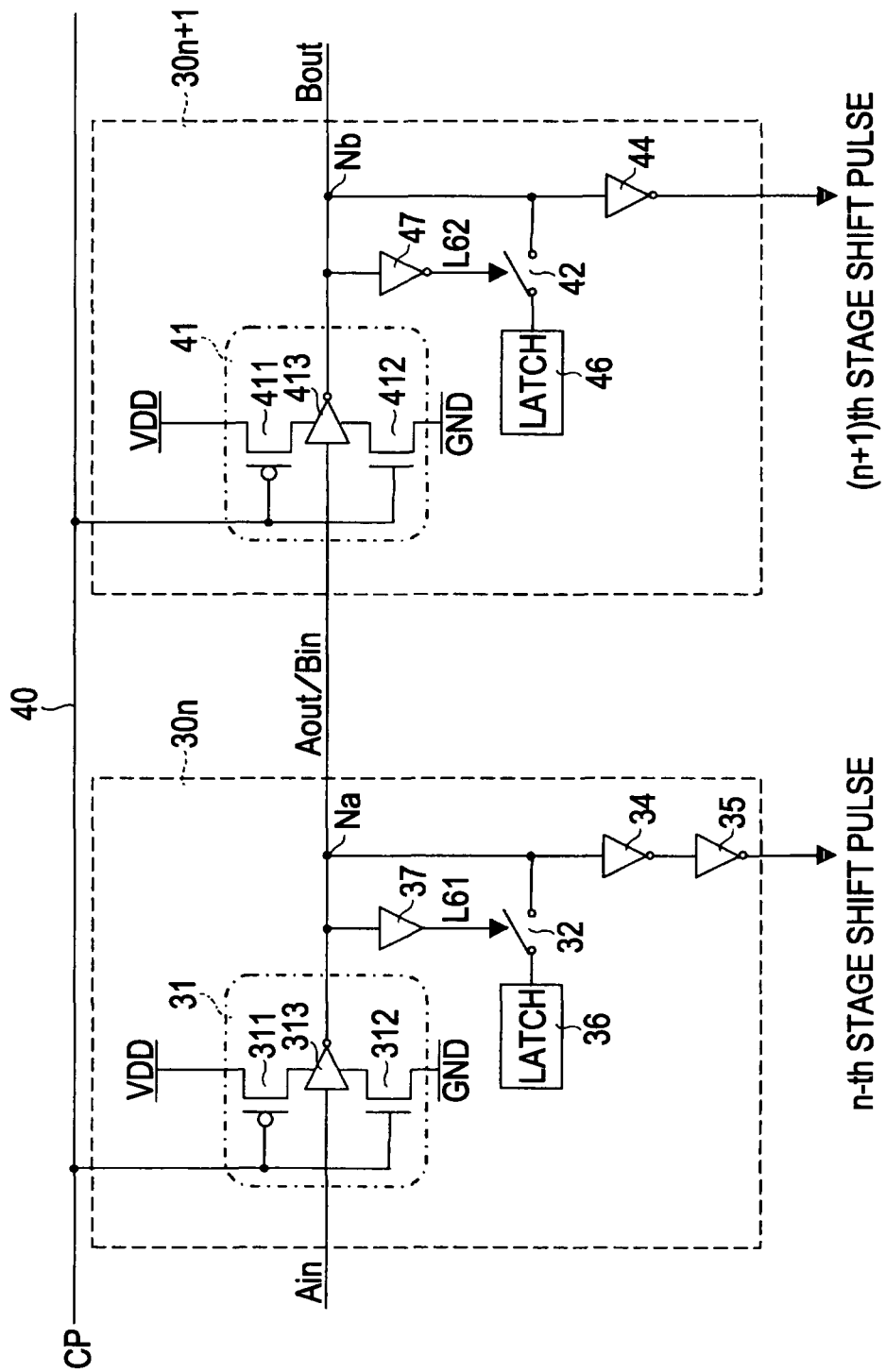
FIG. 6 is a block diagram illustrating a configuration example of a shift register circuit according to a modification of the second embodiment.

FIG. 6 is a block diagram illustrating a configuration example of a shift register circuit according to a modification of the second embodiment. Reference numerals the same as those used in FIG. 4 are used in FIG. 6 to denote the similar component.

As shown in FIG. 6, the shift register circuit according to this modification is different from the shift register circuit of the second embodiment shown in FIG. 4 in that latch circuits 36 and 46 are used instead of the potential supply section (the power supply section) which supplies the power supply potential VDD (in the n-th transfer stage 30n) and the ground potential GND (in the (n+1)th transfer stage 30n+1) as inactive potentials. Specifically, each of the switch elements 32 and 42 has a first terminal connected to an input/output terminal of a corresponding one of the latch circuits 36 and 46.

Furthermore, the shift register circuit according to this modification uses a buffer 37 instead of the control-pulse generation circuit 33 and uses an inverter 47 instead of the control pulse generation circuit 43. The buffer 37 buffers an output pulse Aout of a tri-state inverter 31 and supplies the buffered output pulse Aout as a control pulse to control a switch element 32. The inverter 47 performs polarity reversal processing on an output pulse Bout of a tri-state inverter 41 and supplies the processed output pulse Bout as a control pulse to control a switch element 42. Other portions of the configuration of the shift register circuit according to the modification are basically the same as those of the shift register circuit according to the second embodiment.

Figure 7:
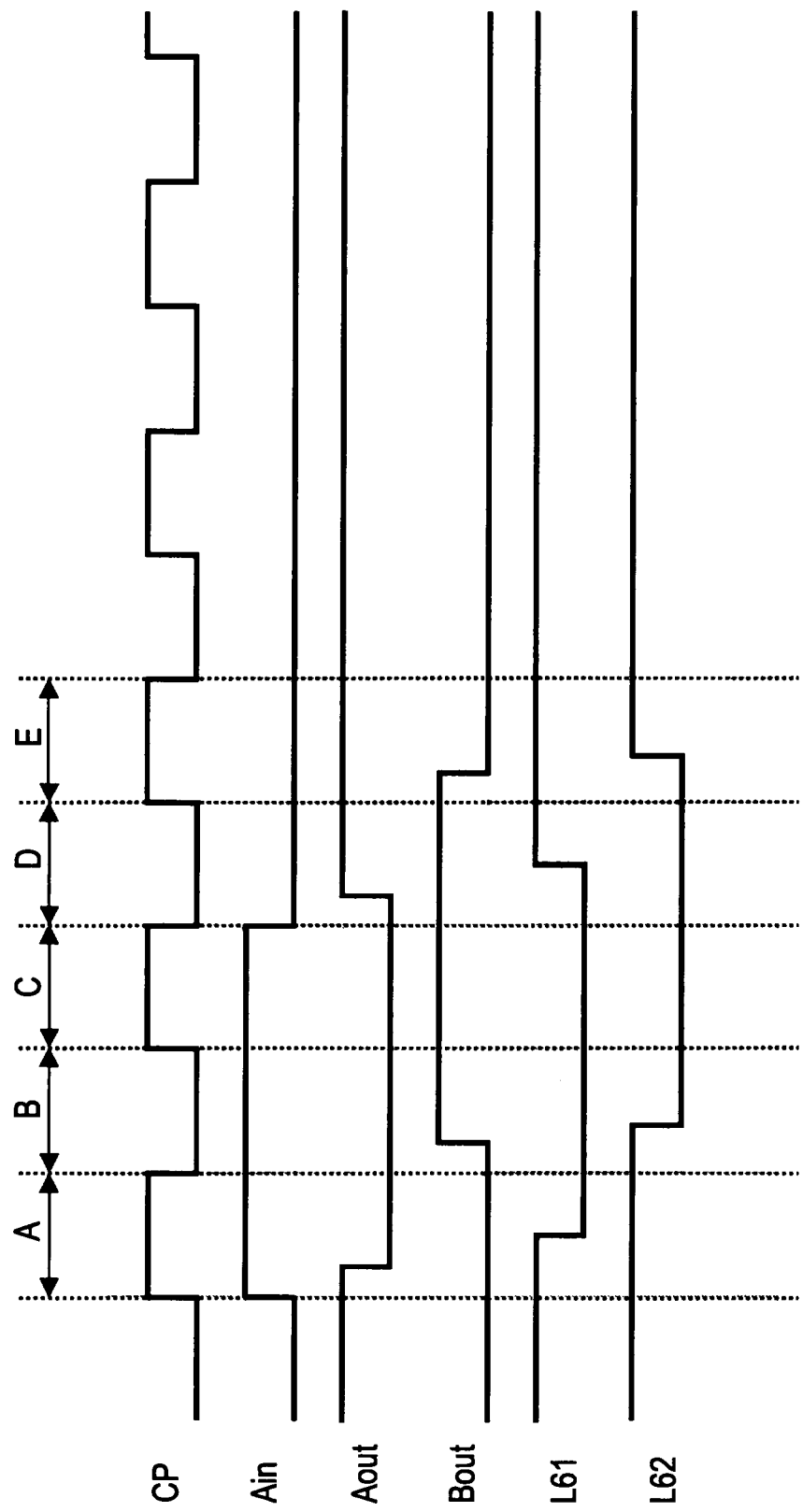
FIG. 7 is a waveform timing chart illustrating an operation of the shift register circuit according to the modification of the second embodiment.

Subsequently, an operation of the shift register circuit according to the modification of the second embodiment configured as above will now be described with reference to the waveform timing chart shown in FIG. 7. Note that, as shown in the waveform timing chart of FIG. 7, the output pulse Aout and the output pulse Bout slightly delay relative to the shift clock CP since the output pulse Aout and the output pulse Bout pass through the tri-state inverters 31 and 41, respectively.

In a period A, an input pulse Ain of the tri-state inverter 31 is brought into the H-level state and the shift clock CP is also brought into the H-level state, an N-channel transistor 312 of the tri-state inverter 31 is turned on. Accordingly, the output pulse Aout of the tri-state inverter 31 is brought into the L-level state.

Since the input pulse Aout is in the L-level state, an output pulse L61 of the buffer 37 is brought into the L-level state. Accordingly, the switch element 32 is turned off and the output node Na and an input/output terminal of the latch circuit 36 are disconnected from each other. Consequently, the output pulse Aout is not influenced by a dynamic change of a characteristic of the latch circuit 36.

In a period B, when the shift clock CP is brought into the L-level state, the output node Na of the n-th transfer stage 30n is brought into a floating state. Then, a potential of the output pulse Aout is kept in the L-level state using an output capacitor of the tri-state inverter 31 included in the n-th transfer stage 30n and an input capacitor of the tri-state inverter 41 included in the (n+1)th transfer stage 30n+1, for example.

In a period C, when the shift clock CP is brought into the H-level state, the N-channel transistor 312 of the tri-state inverter 31 is turned on. Consequently, the output pulse Aout of the tri-state inverter 31 keeps the L-level potential.

In a period D, when the input pulse Ain of the tri-state inverter 31 is brought into the L-level state and the shift clock CP is also brought into the L-level state, a P-channel transistor 311 of the tri-state inverter 31 is turned on. Consequently, the output pulse Aout of the tri-state inverter 31 is brought into the H-level state.

Since the output pulse Aout is brought into the H-level state, the output pulse L61 of the buffer 37 is also brought into the H-level state, and accordingly, the switch element 32 is turned on. Furthermore, since the output node Na and the and the input/output terminal of the latch circuit 36 is connected to each other, the latch circuit 36 latches the H-level output pulse Aout, whereby the output pulse Aout is kept in the H-level state.

Specifically, the output pulse Aout has an active potential, that is, an L-level potential in the first period, and then, keeps an inactive potential, that is, an H-level potential in a second period which is a long period and which lasts until the next input pulse Ain is supplied.

A similar operation is performed in the (n+1)th transfer stage 30n+1. In a period B, the input pulse Bin (the output pulse Aout of the n-th transfer stage 30n) of the tri-state inverter 41 is brought into the L-level state and the shift clock CP is also brought into the L-level state, the P-channel transistor 411 of the tri-state inverter 41 is turned on. Accordingly, the output pulse Bout of the tri-state inverter 41 is brought into the H-level state.

Since the output pulse Bout is brought into the H-level state, an output pulse L62 of the inverter 47 is brought into the L-level state, and accordingly, the switch element 42 is turned off. Therefore, the output node Nb and the input/output terminal of the latch circuit 46 are disconnected from each other. Consequently, the output pulse Bout is not influenced by a dynamic change of a characteristic of the latch circuit 46.

In a period C, when the shift clock CP is brought into the H-level state, the output node Nb of the (n+1)th transfer stage 30n+1 is brought into a floating state. Then, a potential of the output pulse Bout is kept in the H-level state using an output capacitor of the tri-state inverter 41 included in the (n+1)th transfer stage 30n+1 and an input capacitor of the tri-state inverter included in the (n+2)th transfer stage 30n+2.

In a period D, when the shift clock CP is brought into the L-level state, the P-channel transistor 411 of the tri-state inverter 41 is turned on. Consequently, the output pulse Bout of the tri-state inverter 41 keeps the H-level potential.

In a period E, when the input pulse Bin of the tri-state inverter 41 is brought into the H-level state and the shift clock CP is also brought into the H-level state, an N-channel transistor 412 of the tri-state inverter 41 is turned on. Consequently, the output pulse Bout of the tri-state inverter 41 is brought into the L-level state.

Since the output pulse Bout is brought into the L-level state, the output pulse L62 of the inverter 47 is brought into the H-level state, and accordingly, the switch element 42 is turned on. Therefore, since the output node Nb and the input/output terminal of the latch circuit 46 are connected to each other, the latch circuit 46 latches the L-level output pulse Bout whereby the output pulse Bout is kept in the L-level state.

Specifically, the output pulse Bout has an active potential, that is, an H-level potential in the first period, and then, keeps an inactive potential, that is, an L-level potential in a second period which is a long period and which lasts until the next input pulse Bin is supplied.

As described above, even when the latch circuits 36 and 46 are employed instead of the potential supply portion which supplies the power supply potential VDD and the ground potential GND which are inactive potentials, the latch circuits 36 and 46 operate during a period in which the ground potential GND and the power supply potential VDD are latched by utilizing the switch elements 32 and 42. Accordingly, unlike the related art, all transistors included in the latch circuits 36 and 46 are not brought into an enhancement state, and therefore, the shift register circuit is not influenced by transitional changes of transistor characteristics of the latch circuits 36 and 46. Accordingly, an output waveform having a constant width of the shift register circuit is realized. Consequently, sufficient margins for a change of a transistor characteristic and for a change of an operating frequency, high reliability, and high-speed drive are attained.

Note that, although in each of the embodiments and the modifications described above, the sift register circuits to which the switch elements and control circuits for controlling the switch elements are applied in order to achieve the constant output waveforms and improve the potential maintaining functions are taken as examples, the present invention is not limited to them. The present invention may be applicable not only to the shift register circuits but also to a general semiconductor circuit in which a characteristic of an internal element used to maintain a potential at a time of operating the circuit dynamically changes, and to a general semiconductor circuit to which a defect silicon is employed instead of a polysilicon.

Applications

Each of the shift register circuits according to the first and second embodiments and the modifications described above is suitably applicable as a shift register circuit constituting a driving circuit to a flat-surface (panel) display device such as a liquid crystal display device and an EL (electro luminescence) display device. In each of these display apparatus, the driving circuit which drives pixels in a pixel array portion for display is formed on an insulating substrate along with the pixel array portion.

Figure 8:
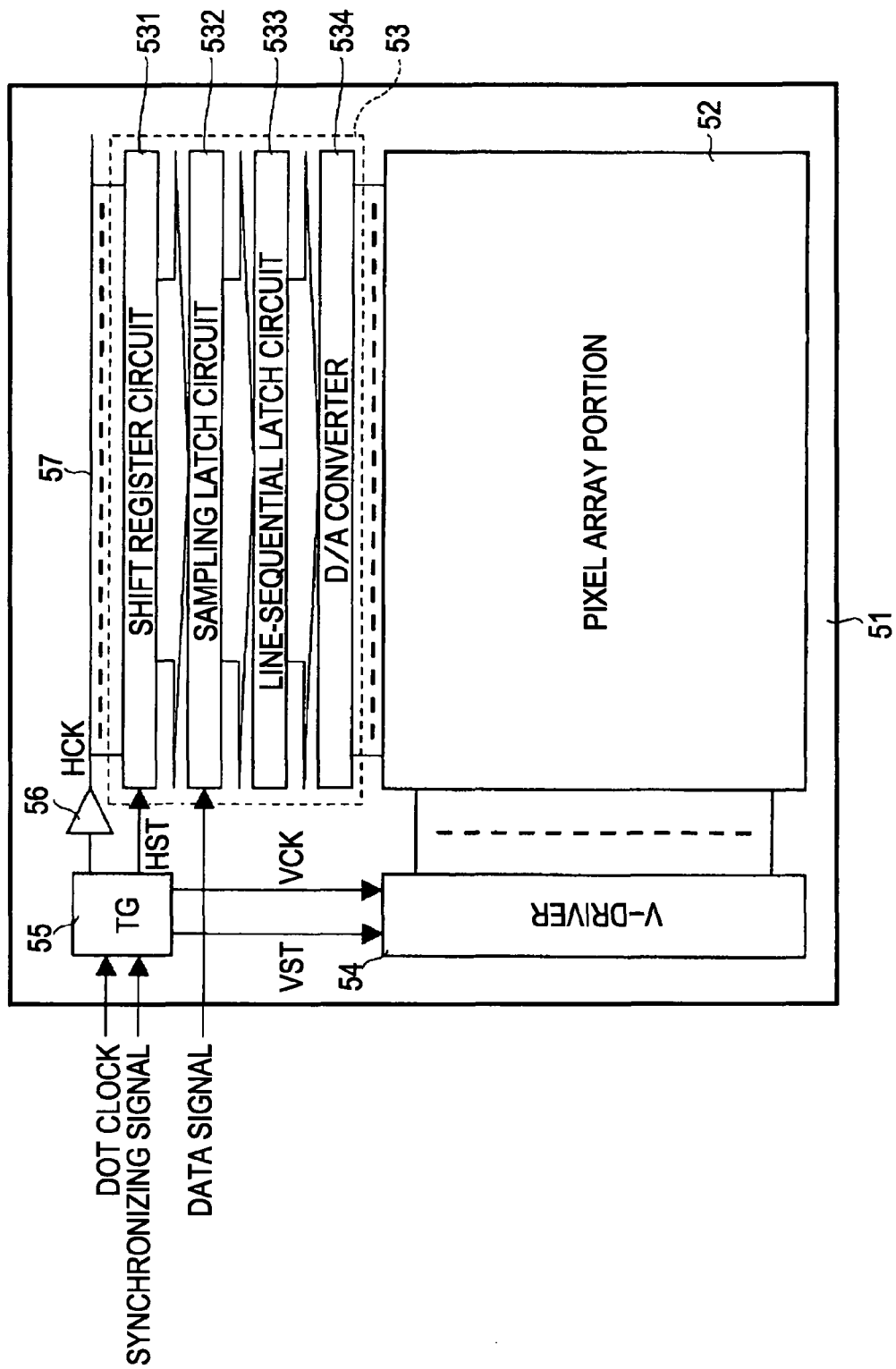
FIG. 8 is a diagram schematically illustrating a configuration example of an active matrix display device to which the present invention is applied.

FIG. 8 is a schematic diagram showing a configuration example of an active matrix display device to which the present invention is applied. Here, a case where the present invention is employed in an active matrix liquid crystal display device in which liquid crystal cells are used as electro-optical elements in pixels will be described as an example.

Referring to FIG. 8, a pixel array portion 52 in which a plurality of pixels including liquid crystal cells are arranged thereon in a matrix, an H-driver (a horizontal driving circuit) 53, V-driver (a vertical driving circuit) 54, a timing generation circuit (TG) 55, and a buffer circuit 56 are implemented on an insulating substrate, such as a glass substrate 51.

The glass substrate 51 includes a first substrate in which a plurality of pixel circuits including active elements (transistors, for example) are arranged thereon in a matrix and a second substrate arranged so as to face the first substrate with a predetermined gap. Liquid crystal is enclosed between the first and second substrates so that a display panel (a liquid crystal panel) is formed.

Figure 9:
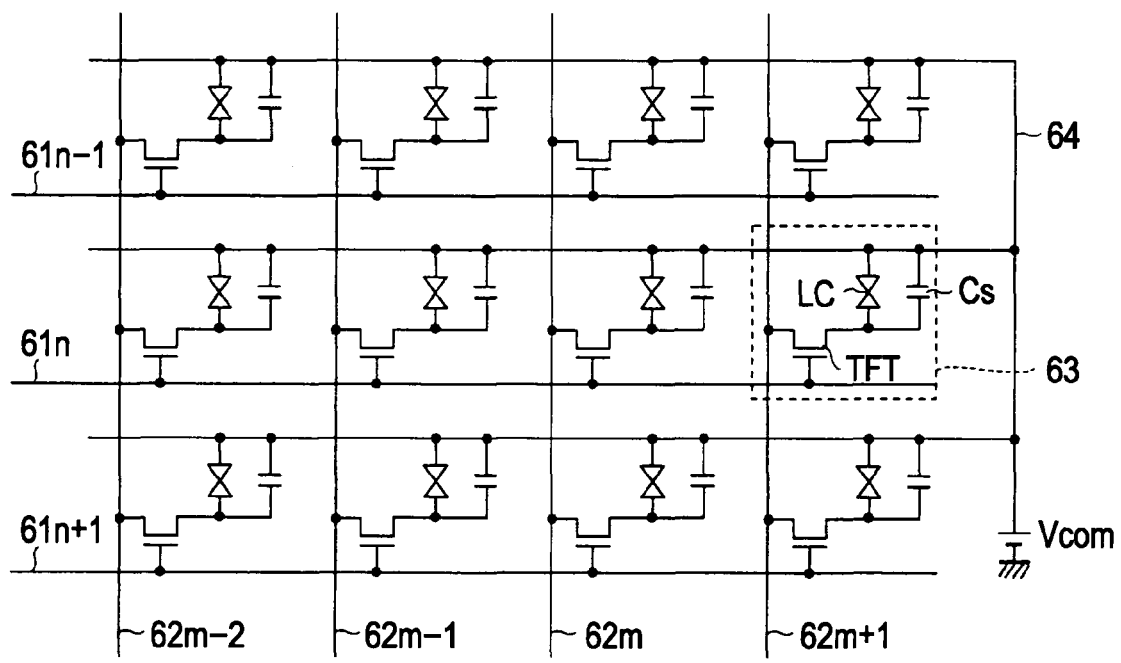
FIG. 9 is a circuit diagram illustrating a configuration example of a pixel array portion in detail.
Figure 10:
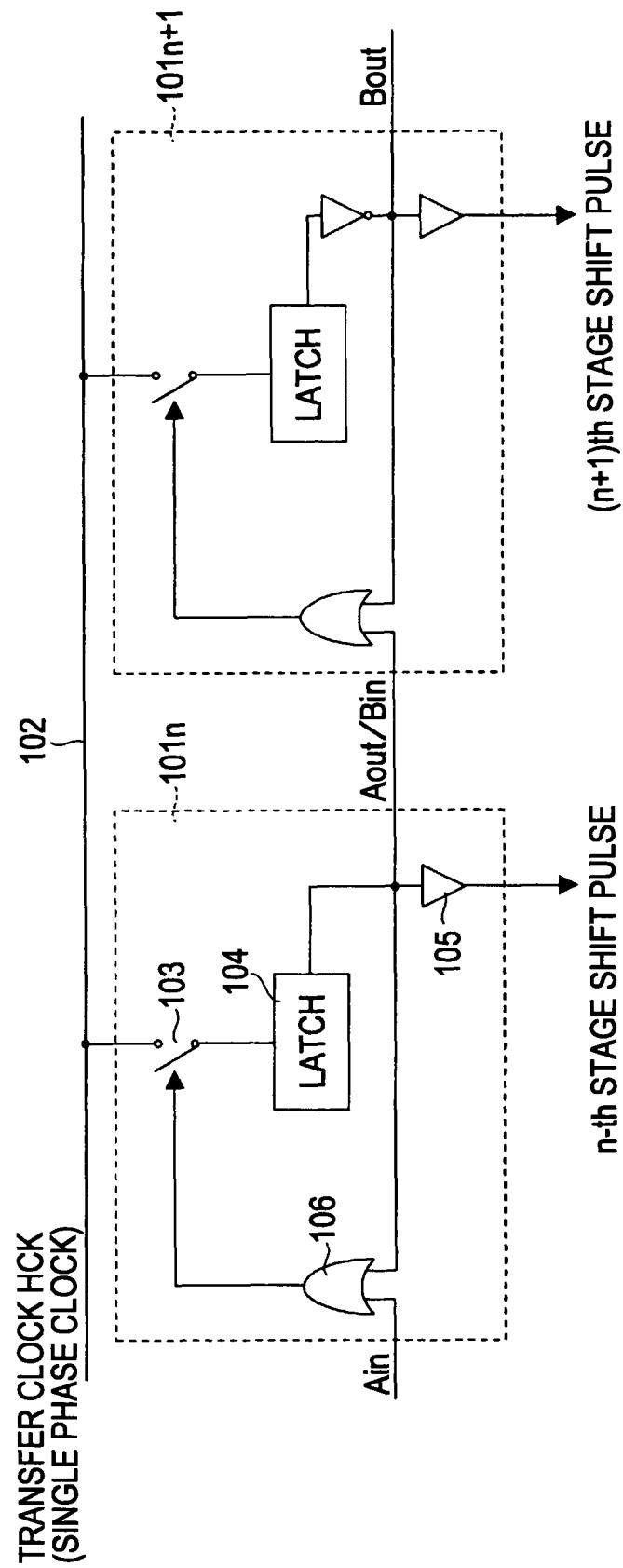
FIG. 10 is a block diagram illustrating a configuration example of a shift register circuit according to the related art.

FIG. 9 shows an example of a configuration of the pixel array portion 52 in detail. Here, a pixel array having three rows (an (n−1)th to (n+1)th rows) and four columns (an (m−2)th to (m+1)th columns) is shown as an example for simplicity. In FIG. 9, the pixel array portion 52 includes vertical scanning lines 61n−1 to 61n+1 and data lines (signal lines) 62m−2 to 62m+1 which are arranged in a matrix and unit pixels 63 which are arranged at intersections of the vertical scanning lines 61n−1 to 61n+1 and data lines 62m−2 to 62m+1.

The unit pixels 63 includes thin-film transistors TFT, liquid crystal cells LC, and hold capacitors Cs. Here, the liquid crystal cells LC mean capacitances generated between pixel electrodes (first electrodes) formed of the thin-film transistors TFT and counter electrodes (second electrodes) arranged so as to face the pixel electrodes.

The thin-film transistors TFT have the gate electrodes connected to the corresponding vertical scanning lines 61n−1 to 61n+1 and the source electrodes connected to the corresponding data lines 62m−2 to 62m+1. The liquid crystal cells LC have pixel electrodes connected to the drain electrodes of the corresponding thin-film transistors TFT and the counter electrodes connected to a common line 64. The hold capacitors Cs are connected between the drain electrodes of the corresponding thin-film transistors TFT and the common line 64. A counter electrode voltage (a common voltage) Vcom is supplied to the common line 64.

First ends of the vertical scanning lines 61*n*–1 to 61+1 are connected to corresponding output terminals of rows of the V-driver 54 shown in FIG. 8. The V-driver 54 is constituted by a shift register circuit, for example, and starts operating in response to a vertical start pulse VST. In addition, the V-driver 54 sequentially generates vertical selection pulses in synchronization with vertical transfer clocks VCK, supplies the generated vertical selection pulses to the vertical scanning lines 61*n*–1 to 61+1 whereby vertical scanning is performed.

First ends of the data lines 62*m*–2 to 62*m*+1 are connected to corresponding output terminals of rows of the an H-driver 53 shown in FIG. 8. The an H-driver 53 is a digital interface driver including, as shown in FIG. 8, for example, a shift register circuit 531, a sampling latch circuit (a data signal input circuit) 532, a line-sequential latch circuit 533, and a D/A (digital/analog) converter 534.

In the H-driver 53, the shift register circuit 531 starts operating in response to a horizontal start pulse HST, and sequentially outputs shift pulses from transfer stages in synchronization with horizontal transfer clocks HCK whereby horizontal scanning is performed. The sampling latch circuit 532 samples and latches input digital image data having predetermined bits on a point-sequential basis in response to the shift pulses supplied from the shift register circuit 531.

The digital image data which has been latched on a point-sequential basis using the sampling latch circuit 532 is latched again using the line-sequential latch circuit 533 on a line-by-line basis, that is, on a line-sequential basis. The digital image data is output on a line-by-line basis. The D/A converter 534 has a reference voltage selection type circuit configuration, for example, converts the digital image data for one line output from the line-sequential latch circuit 533 into analog image signals, and supplies the converted analog image signals to the data lines 62*m*–2 to 62*m*+1 arranged on the pixel array portion 52.

The timing generation circuit 55 generates a horizontal synchronization signal HD and a vertical synchronization signal VD which are externally supplied and various timing signals such as the vertical start pulse VST, the vertical transfer clock VCK, the horizontal start pulse HST, and the horizontal transfer clock HCK, which are described above, on the basis of dot clocks having frequencies determined in accordance with the number of pixels (dots) in a horizontal direction of the pixel array portion 52.

Among the various timing signals generated using the timing generation circuit 55, the horizontal transfer clock HCK is a single-phase clock obtained from two dot clock cycle. The single-phase horizontal transfer clock HCK is supplied through the buffer circuit 56 to a clock supply line 57 arranged further than the shift register circuit 531 relative to the pixel array portion 52. The clock supply line 57 is arranged in a transfer (shift) direction of the shift register circuit 531, and supplies the horizontal transfer clock HCK to each of the transfer stages of the shift register circuit 531.

In the active matrix liquid crystal display device having the configuration described above, each of the shift register circuits according to the first and second embodiments and the modifications is used as a driving circuit which drives the unit pixels 63 included in the pixel array portion 52 for display, and specifically, is used as the shift register circuit 531 of the H-driver 53. Accordingly, each of the shift register circuits according to the first and second embodiments and the modifications realizes a constant width of an output waveform, sufficient margins for a change of a transistor characteristic and for a change of an operating frequency, high reliability, and high-speed drive of the shift register circuit 531. Consequently, characteristics of the liquid crystal display device are considerably improved.

Specifically, in the shift register circuit according to the first embodiment, since the number of transistors may be reduced by four times the number of stages of the shift register circuit 531 (the number of cells), the size of the shift register circuit 531 is considerably reduced. Accordingly areas of the driving circuits on the display panel may be reduced, and specifically, the size of a frame of the display panel (the size of the periphery of the pixel array portion 52) may be reduced.

Note that, in this application, each of the shift register circuits according to the first and second embodiments and the modifications is used as the shift register circuit 531 of the H-driver 53. However, the each of the shift register circuits according to the first and second embodiments and the modifications is also used as a shift register circuit included in the V-driver 54 instead of the H-driver 53.

Figure 13:
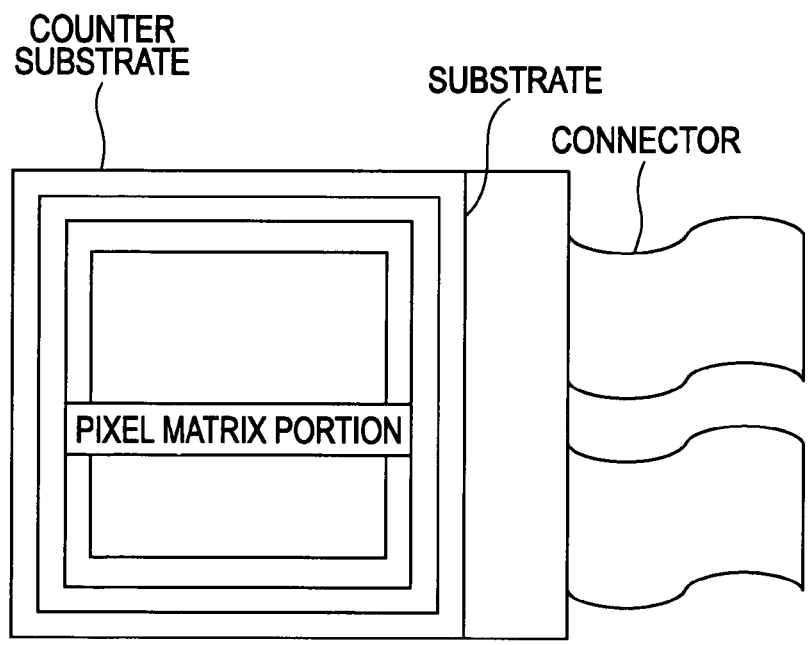
FIG. 13 is a plan view illustrating a module configuration of a display device according to the present invention.

The display apparatus according to the present invention includes a flat-module display apparatus shown in FIG. 13. For example, a pixel array portion configured such that pixels are integrated and arranged in a matrix is disposed on an insulating substrate. Each of the pixels includes a liquid crystal element, an organic EL device, a thin-film transistor, and a thin-film capacitor. A bonding material is arranged so as to surround the pixel array portion (a pixel matrix portion), and a counter substrate such as a glass substrate is attached to the insulating substrate by the bonding material whereby a display module is formed. The transparent counter substrate may be provided with a color filter, a protective film, and a light-shielding film as needed. The display module may include a connector used for receiving/supplying signals from/to outside of the pixel array portion, such as an FPC (flexible printed circuit).

The above-described display apparatus according to the present invention has a flat-panel shape, and is applicable as a display apparatus to various electronic apparatuses in various fields, such as a digital still camera, a laptop personal computer, a cellular phone, and a video camera, which are capable of displaying video signals input to or generated in the electronic apparatuses as images or as video images. Examples of a display apparatus employing such a display apparatus will be described hereinafter.

Figure 14:
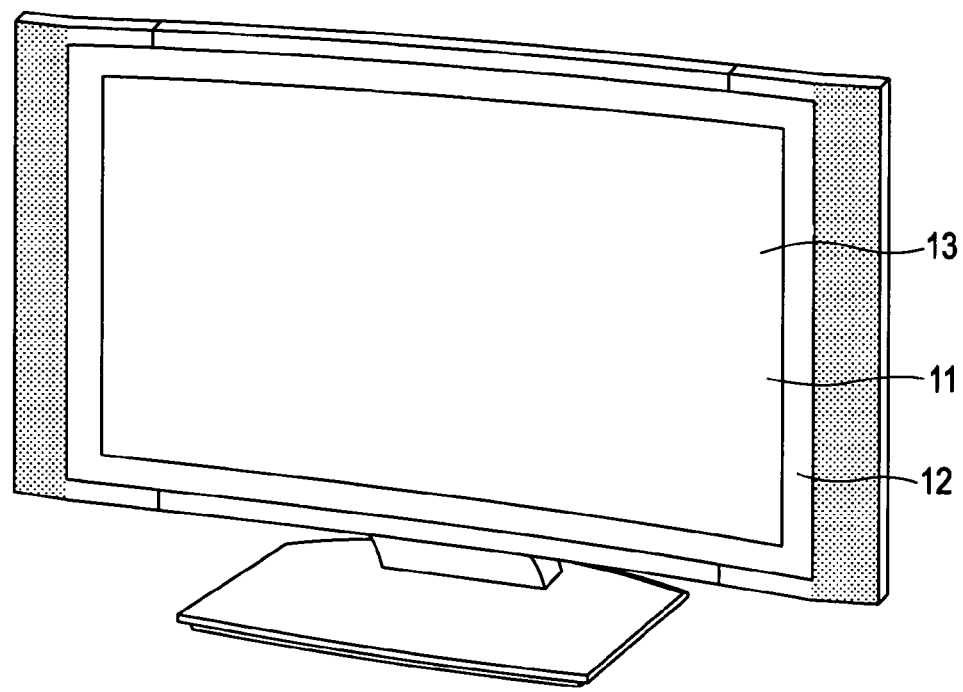
FIG. 14 is a perspective view illustrating a television set which employs the display device according to the present invention.

FIG. 14 shows a television set to which the present invention is applied. The television set includes a front panel 12 and a video image display screen 11 constituted by a filter glass 13. The display apparatus according to the present invention is employed as the video image display screen 11.

Figure 15A:
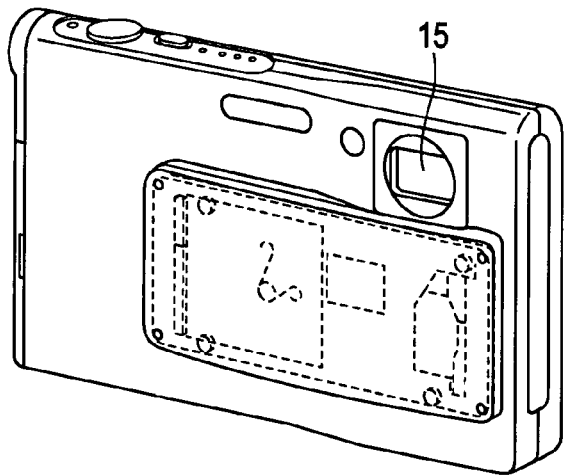
FIGS. 15A and 15B are perspective views illustrating a digital still camera which employs the display device according to the present invention.
Figure 15B:
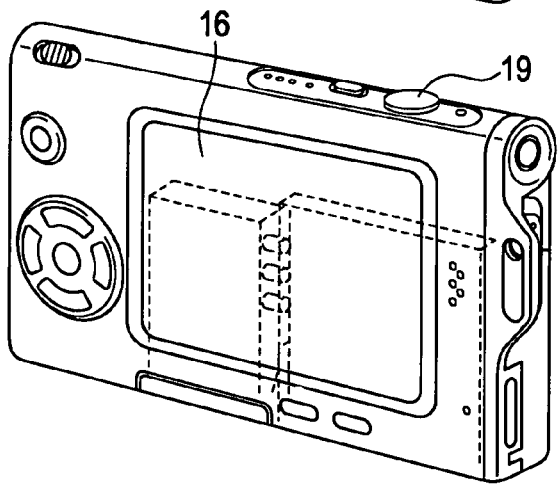

FIGS. 15A and 15B show a digital still camera to which the present invention is applied, FIG. 15A being a front view and FIG. 15B being a back view. This digital still camera includes an image-pickup lens, a light-emission portion 15 for flash photography, a display 16, a control switch, a menu switch, and a shutter 19. The display apparatus according to the present invention is employed as the display 16.

Figure 16:
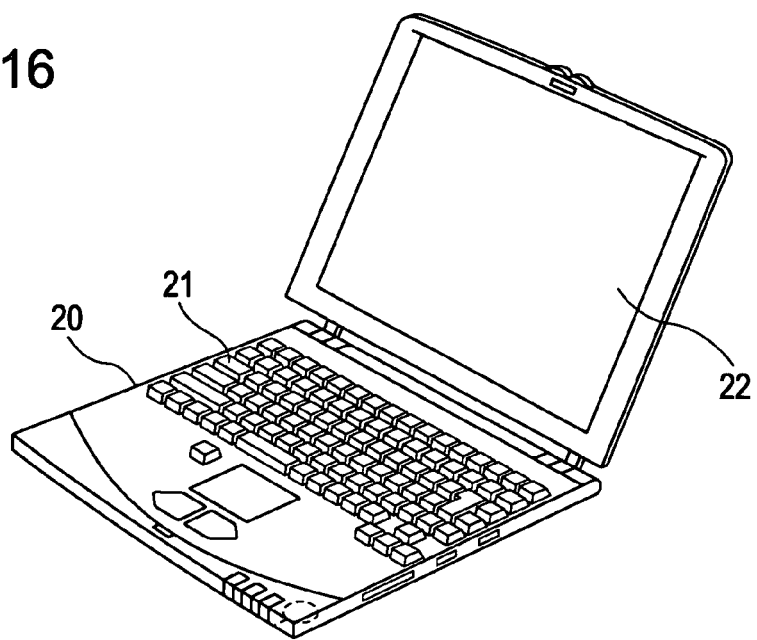
FIG. 16 is a perspective view illustrating a laptop personal computer which employs the display device according to the present invention.

FIG. 16 shows a laptop personal computer to which the present invention is applied. The laptop personal computer includes a body 20 having a keyboard 21 used for inputting characters and a body cover having a display 22 for displaying images. The display apparatus according to the present invention is employed as the display 22.

Figure 17A:
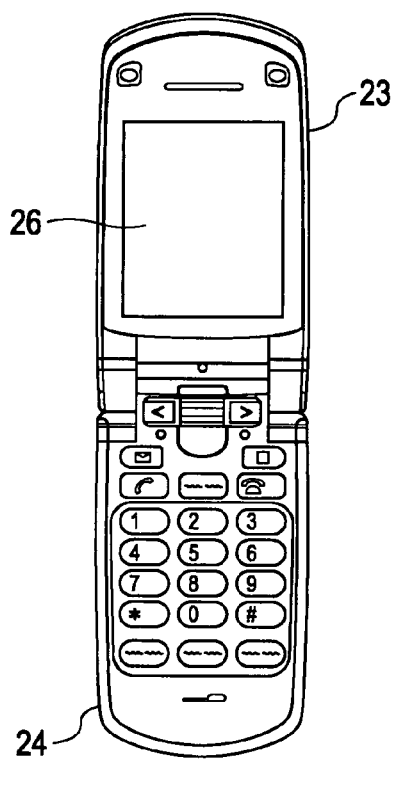
FIGS. 17A and 17B are schematic views illustrating a mobile terminal apparatus which employs the display device according to the present invention.
Figure 17B:
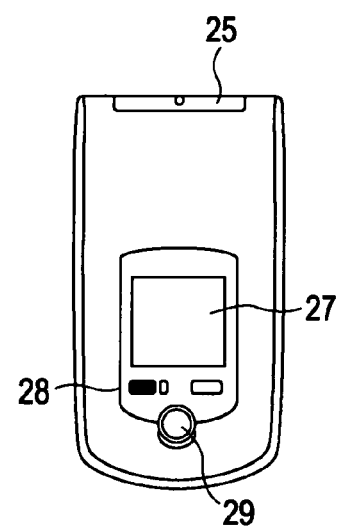

FIGS. 17A and 17B show mobile terminals to which the present invention is applied, FIG. 17A showing the mobile terminal in an open state and FIG. 17B showing the mobile terminal in a closed state. The mobile terminal includes an upper body 23, a lower body 24, a connection portion (a hinge portion herein) 25, a display 26, a sub-display 27, a picture light 28, and a camera unit 29. The display apparatus according to the present invention is employed as the display 26 and the sub-display 27.

Figure 18:
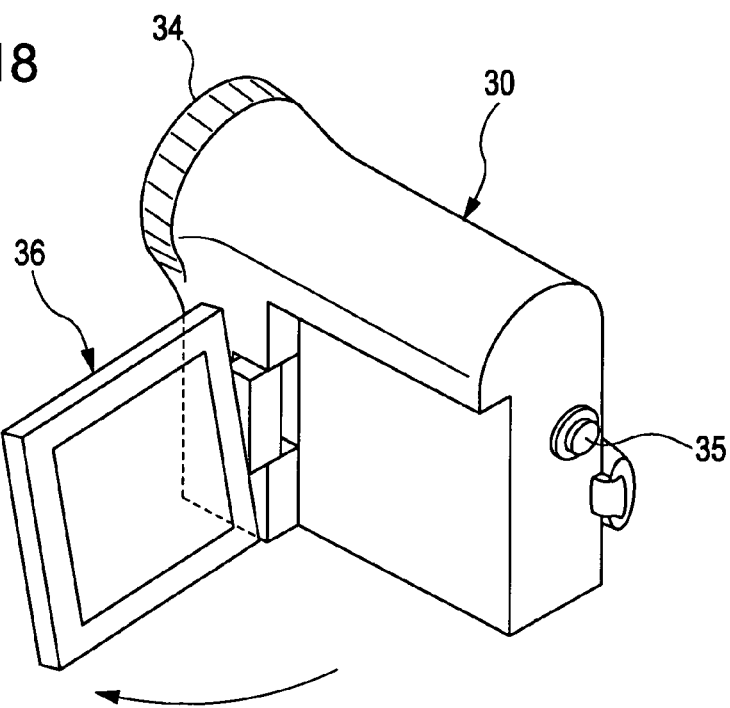
FIG. 18 is a perspective view illustrating a video camera which employs the display device according to the present invention.

FIG. 18 shows a video camera to which the present invention is applied. The video camera includes a body 30, a lens 34 which is disposed on a front side of the body 30 and which is used for capturing an image of a subject, a start/stop switch 35 used for shooting, and a monitor 36. The display apparatus according to the present invention is employed as the monitor 36.

It should be understood by those skilled in the art that various modifications, combinations, sub-combinations and alterations may occur depending on design requirements and other factors insofar as they are within the scope of the appended claims or the equivalents thereof.

What is claimed is:

1. A shift register circuit comprising:
    a control circuit configured set a control line to an active potential or an inactive potential, a first input line of the control circuit being configured to receive a first latch pulse;
    a first switch element configured to make an electrical connection between a clock supply line and a connection terminal when said control line is at said active potential, said control circuit setting said control line to said active potential when either said first latch pulse or said second latch pulse is at a logic level state;
    a second switch element configured to make an electrical connection between a potential supply section and said connection terminal when said control line is at said inactive potential, said control circuit setting said control line to said inactive potential when neither said first latch pulse nor said second latch pulse is at said logic level state,
    wherein said connection terminal is directly electrically connected to an input of an inverter, an output of the inverter being directly electrically connected to said first input line.

2. The shift register circuit according to claim 1, wherein said connection terminal is directly electrically connected to said first input line.

3. The shift register circuit according to claim 1, wherein a second input of the control circuit is configured to receive a second latch pulse.

4. The shift register circuit according to claim 1, wherein said control line is at said inactive potential longer than at said active potential.

5. A shift register comprising:
    a control circuit configured set a control line to an active potential or an inactive potential;
    a first switch element configured to make an electrical connection between a clock supply line and a connection terminal when said control line is at said active potential said control circuit setting said control line to said active potential when either said first latch pulse or said second latch pulse is at a logic level state;
    a second switch element configured to make an electrical connection between a potential supply section and said connection terminal when said control line is at said inactive potential, said control circuit setting said control line to said inactive potential when neither said first latch pulse nor said second latch pulse is at said logic level state,
    wherein said potential supply section is a latch circuit.

6. The shift register circuit according to claim 1, wherein said potential supply section is configured to supply a power supply potential.

7. The shift register circuit according to claim 1, wherein said potential supply section is configured to supply a ground potential.

8. The shift register circuit according to claim 1, wherein said first switch element is configured to break said electrical connection between the connection terminal and the clock supply line when said control line is at said inactive potential.

9. The shift register circuit according to claim 1, wherein said first switch element is configured to break said electrical connection between the connection terminal and the clock supply line during when said second switch element makes said electrical connection between the connection terminal and the potential supply section.

10. The shift register circuit according to claim 1, wherein said second switch element is configured to break said electrical connection between the connection terminal and the potential supply section when said control line is at said active potential.

11. The shift register circuit according to claim 1, wherein said second switch element is configured to break said electrical connection between the connection terminal and the potential supply section during when said first switch element makes said electrical connection between the connection terminal and the clock supply line.

12. The shift register circuit according to claim 1, wherein said control circuit is an OR gate.

13. The shift register circuit according to claim 1, wherein said logic level state is a digital logic level "1".

14. The shift register circuit according to claim 1, wherein said logic level state is a digital logic level "0".

15. The shift register circuit according to claim 1, wherein said clock supply line is configured to propagate a clock signal.

16. The shift register circuit according to claim 1, wherein said potential supply section is a latch circuit.

17. A display device comprising:
    the shift register circuit according to claim 1; and
    pixels arranged in a matrix, each of the pixels having an electro-optical element.

* * * * *